(12) United States Patent
Sarraf et al.

(10) Patent No.: US 11,022,379 B2
(45) Date of Patent: Jun. 1, 2021

(54) CTE-MATCHED HEAT PIPE

(71) Applicant: Thermal Corp., Wilmington, DE (US)

(72) Inventors: David Sarraf, Elizabethtown, PA (US);
John Hartenstine, Mountville, PA (US); Jerome Toth, Exton, PA (US);
Scott Garner, Lititz, PA (US)

(73) Assignee: Aavid Thermal Corp., Wilmington, DE (US)

( * ) Notice: Subject to any disclaimer, the term of this patent is extended or adjusted under 35 U.S.C. 154(b) by 55 days.

(21) Appl. No.: 16/372,292

(22) Filed: Apr. 1, 2019

(65) Prior Publication Data

US 2019/0360761 A1 Nov. 28, 2019

Related U.S. Application Data

(63) Continuation of application No. 15/448,949, filed on Mar. 3, 2017, now Pat. No. 10,247,486, which is a continuation of application No. 13/074,987, filed on Mar. 29, 2011, now abandoned, which is a continuation of application No. 11/065,465, filed on
(Continued)

(51) Int. Cl.
| | |
|---|---|
| *F28F 7/00* | (2006.01) |
| *F28D 15/04* | (2006.01) |
| *F28D 15/02* | (2006.01) |
| *H01L 23/427* | (2006.01) |
| *F28F 1/00* | (2006.01) |
| *F28F 1/24* | (2006.01) |

(Continued)

(52) U.S. Cl.
CPC .............. *F28D 15/04* (2013.01); *F28D 15/02* (2013.01); *F28D 15/0275* (2013.01); *F28D 15/0283* (2013.01); *F28F 1/003* (2013.01); *F28F 1/24* (2013.01); *F28F 21/081* (2013.01); *F28F 21/085* (2013.01); *H01L 23/427* (2013.01); *F28F 21/02* (2013.01); *F28F 2220/00* (2013.01); *H01L 2924/0002* (2013.01); *H01L 2924/3011* (2013.01)

(58) Field of Classification Search
CPC .......... F28D 15/04; F28D 15/00; F28D 15/02; F28D 15/0275; F28D 15/0283; F28D 15/025; F28D 15/043; F28D 15/046; F28D 9/00; F28D 9/0031; F28D 9/0062; F28D 15/0233; H01L 23/3735; H01L 23/3736; H01L 23/427; H01L 2924/0002; H01L 2924/3011; H05K 7/20336; F28F 1/003; F28F 1/24; F28F 21/081; F28F 21/085; F28F 21/02; F28F 2220/00; F28F 21/08
USPC ........................................ 165/104.21, 104.33
See application file for complete search history.

(56) References Cited

U.S. PATENT DOCUMENTS

| | | | | |
|---|---|---|---|---|
| 3,852,806 A | * | 12/1974 | Corman .............. | F28D 15/0275 257/715 |
| 4,214,406 A | | 7/1980 | Wittman et al. | |

(Continued)

FOREIGN PATENT DOCUMENTS

JP S6042593 A 3/1985

*Primary Examiner* — Henry T Crenshaw
*Assistant Examiner* — Kamran Tavakoldavani
(74) *Attorney, Agent, or Firm* — Michael Best & Friedrich LLP

(57) ABSTRACT

Heat sinks having a mounting surface with a coefficient of thermal expansion matching that of silicon are disclosed. Heat pipes having layered composite or integral composite low coefficient of expansion heat sinks are disclosed that can be mounted directly to silicon semiconductor devices.

20 Claims, 16 Drawing Sheets

Related U.S. Application Data

Feb. 24, 2005, now abandoned, which is a continuation-in-part of application No. 10/924,586, filed on Aug. 24, 2004, now Pat. No. 7,048,039, which is a continuation of application No. 10/458,168, filed on Jun. 10, 2003, now Pat. No. 6,793,009.

(51) Int. Cl.
*F28F 21/08* (2006.01)
*F28F 21/02* (2006.01)

(56) References Cited

U.S. PATENT DOCUMENTS

| | | | |
|---|---|---|---|
| 4,693,306 | A | 9/1987 | Nilson |
| 4,836,275 | A | 6/1989 | Sakaya et al. |
| 5,216,580 | A | 6/1993 | Davidson et al. |
| 5,582,242 | A | 12/1996 | Hamburgen et al. |
| 5,632,158 | A | 5/1997 | Tajima |
| 6,014,312 | A | 1/2000 | Schulz-Harder et al. |
| 6,070,656 | A | 6/2000 | Dickey |
| 6,373,131 | B1 * | 4/2002 | Karnezos ............ H01L 23/3128 257/712 |
| 6,450,250 | B2 | 9/2002 | Guerrero |
| 6,473,303 | B2 * | 10/2002 | Kaufmann .......... H01L 21/4882 165/80.4 |
| 2002/0080582 | A1 | 6/2002 | Chang |
| 2003/0066628 | A1 | 4/2003 | Mochizuki et al. |

\* cited by examiner

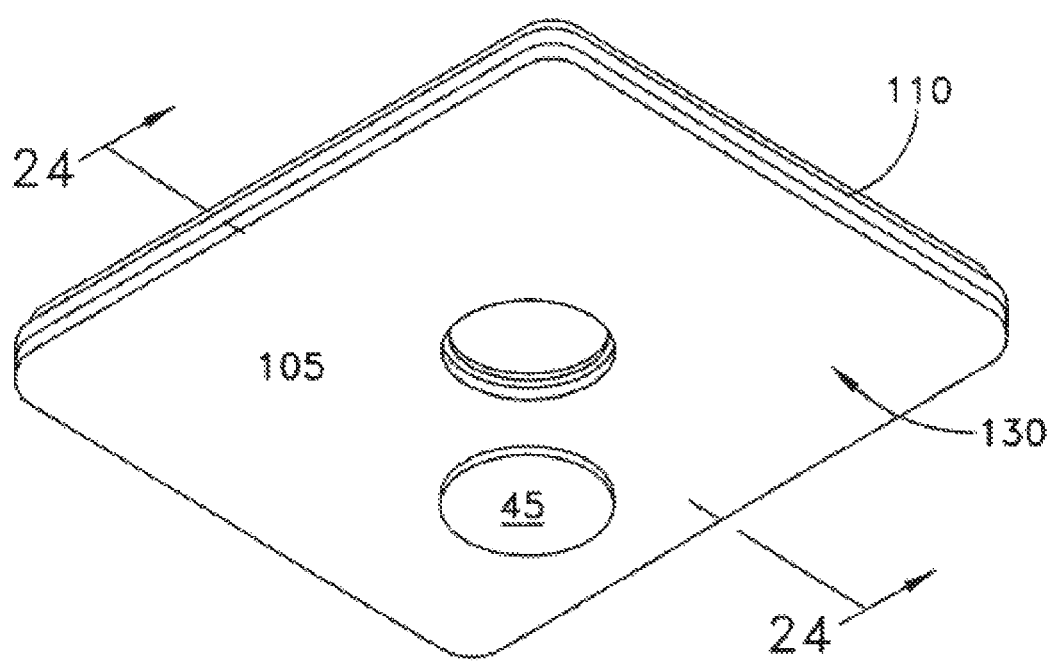
FIG. 23
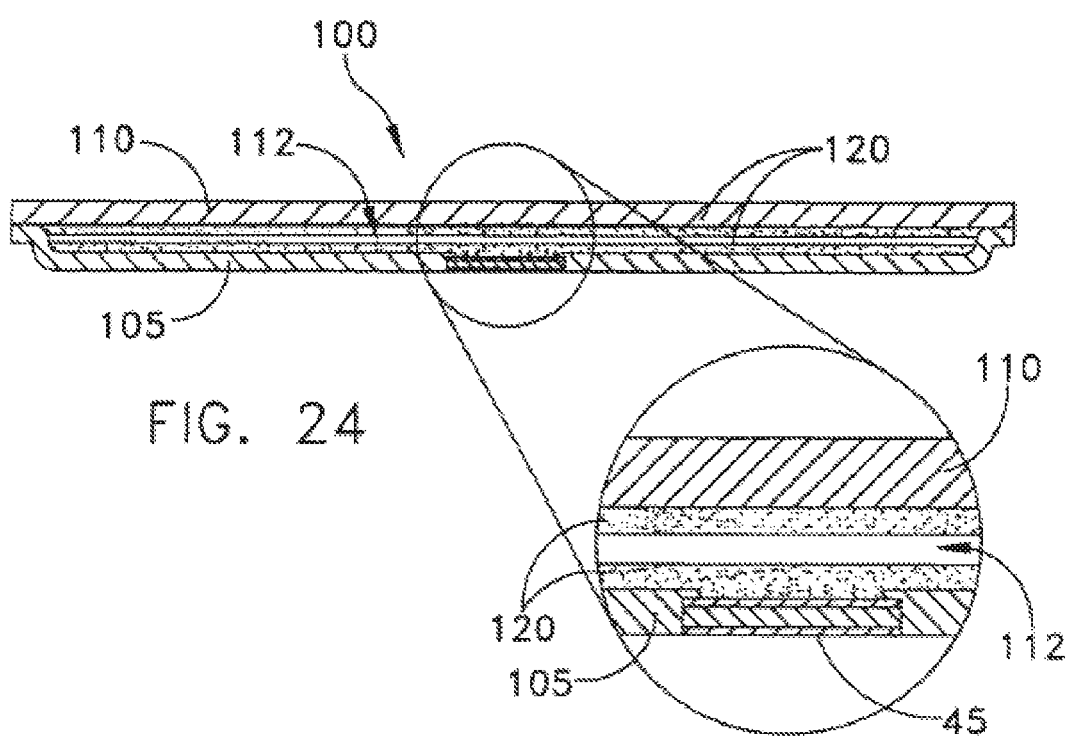
FIG. 24
FIG. 25

CTE-MATCHED HEAT PIPE

CROSS-REFERENCE TO RELATED APPLICATION

This application is a continuation of U.S. patent application Ser. No. 15/448,949, filed Mar. 3, 2017, which is a continuation of U.S. patent application Ser. No. 13/074,987, filed Mar. 29, 2011, which published as Publication No. 2011/0176276, which is a continuation of U.S. patent application Ser. No. 11/065,465, filed Feb. 24, 2005, which published as Publication No. 2005/0139995, which is itself a continuation-in-part of U.S. patent application Ser. No. 10/924,586, filed Aug. 24, 2004, now U.S. Pat. No. 7,048,039, which is itself a continuation of U.S. patent application Ser. No. 10/458,168, filed Jun. 10, 2003, now U.S. Pat. No. 6,793,009, the content of each of which is incorporated herein by reference in its entirety. This application also incorporates herein by reference U.S. Provisional Patent Applications Nos. 60/561,436, filed Apr. 12, 2004, and 60/574,158, filed May 25, 2004, in their entireties.

FIELD OF THE INVENTION

The present invention relates to heat sinks having mounting surfaces for semiconductors, and more particularly to such heat sinks which include one or more mounting surfaces having a coefficient of thermal expansion that matches or nearly matches silicon.

BACKGROUND

It is known that certain classes of semiconductor devices consume substantial amounts of power, which results in excess thermal energy that then must be transferred to the ambient environment. This waste heat is typically communicated through a variety of thermal interfaces, heat spreaders, and structural elements prior to being rejected into the ambient atmosphere by a heat sink. Since heat is often dissipated to room temperature air, and the silicon constructed semiconductor has a finite upper bound on its operating temperature, package-related thermal resistance is becoming a limiting factor in the ability to dissipate the waste heat.

The removal of package elements and interfaces will reduce package thermal resistance, and allow the semiconductor device to either run cooler or dissipate more power. However, many of these elements are required in order to provide a match between the relatively low coefficient of thermal expansion (CTE) of silicon and the relatively high CTE of the metal comprising the heat sink, rather than for best thermal performance. This match needs to be maintained in order to prevent build-up of stress, as well as subsequent damage due to failure of the relatively brittle silicon component. Thus, there are the competing structural requirements of providing a layer of material to provide a CTE match while at the same time needing to bring the heat transfer structure into intimate physical contact with the heat generating structure.

Matching may be achieved by at least two methods: the use of an alloy substrate such as copper/tungsten whose CTE matches or nearly matches that of the silicon, or through the use of a ductile braze alloy between the silicon and the remaining package elements. Either method prevents transmission of stresses due to mismatched CTE through the interface to the silicon device. Some disadvantages of the alloy substrate include expense, unfavorable machining and stamping characteristics, and a fairly low thermal conductivity. Some disadvantages of the ductile braze alloy include a limited fatigue life, which eventually results in failure due to delamination of the joint. This tendency is exacerbated by the service conditions of most high power devices. Such devices almost always operate under conditions of periodic fluctuating electrical load, which leads to periodic fluctuations in thermal load and mechanical stresses in the joint.

An alternative method involves the use of direct bond copper (DBC) aluminum nitride (AlN) in sheet form. This material is a "sandwich" comprised of a single layer of aluminum nitride and two outer layers of OFE copper foil. The copper layers are first oxidized, and then pressed against the AlN at high temperature in a neutral atmosphere. This process causes the oxide to diffuse into the AlN and bonds the copper sheets tightly to the AlN inner layer. Since the copper layers are relatively thin and are in an annealed state due to the high processing temperature, the CTE of the resulting assembly is largely governed by that the of the AlN.

None of the foregoing techniques have been found to be completely satisfactory or have been successfully applied to heat pipe cooling devices.

SUMMARY

In one embodiment, a heat transfer device generally includes an interior chamber defined at least in part by a layered-composite wall. The layered-composite wall includes a first layer of material comprising a coefficient of thermal expansion that is substantially similar to the coefficient of thermal expansion of silicon. The first layer is disposed between and directly engages second layers of material comprising a coefficient of thermal expansion greater than the coefficient of thermal expansion of silicon. The wall has a periphery that is out of plane with respect to a remainder of the wall.

In another embodiment, a heat pipe generally includes a body defining an interior chamber, a wick disposed on portions of the body that define the interior chamber, and a working fluid. The interior chamber is defined at least in part by a layered-composite wall. The layered-composite wall includes a first layer of material comprising a coefficient of thermal expansion that is substantially similar to the coefficient of thermal expansion of silicon. The first layer is disposed between and directly engages second layers of material comprising a coefficient of thermal expansion greater than the coefficient of thermal expansion of silicon. The wall has a periphery that is out of plane with respect to a remainder of the wall.

In a further embodiment, a heat pipe generally includes a body defining an interior chamber, a wick disposed on portions of the body that define the interior chamber, and a working fluid. The interior chamber is defined at least in part by a layered-composite wall of molybdenum disposed between layers of oxygen-free electronic copper foil. The wall has a periphery that is out of plane with respect to a remainder of the wall.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein:

FIG. 23 is a perspective view of a planar heat pipe comprising a composite wall and a low CTE insert formed in accordance with another embodiment of the invention;

FIG. 24 is a cross-sectional view of the planar heat pipe shown in FIG. 23, as taken along lines 24-24 in FIG. 23;

FIG. 25 is an enlarged cross-sectional view of the interior wall structures of a planar heat pipe formed in accordance with the present invention;

DETAILED DESCRIPTION

Figure 1:
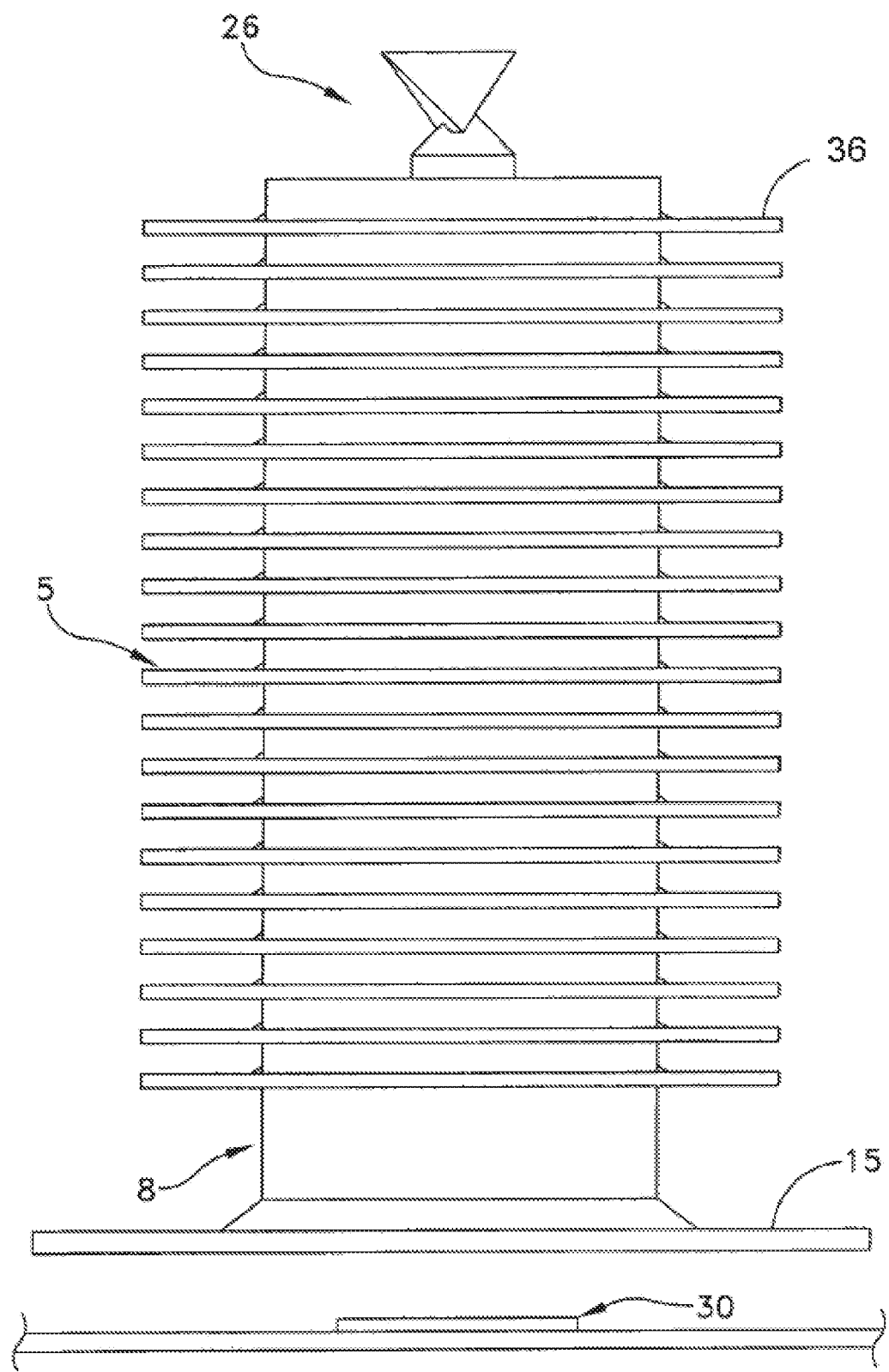
FIG. 1 is a partly exploded, elevational view of a CTE-matched heat pipe formed in accordance with one embodiment of the present invention.
Figure 2:
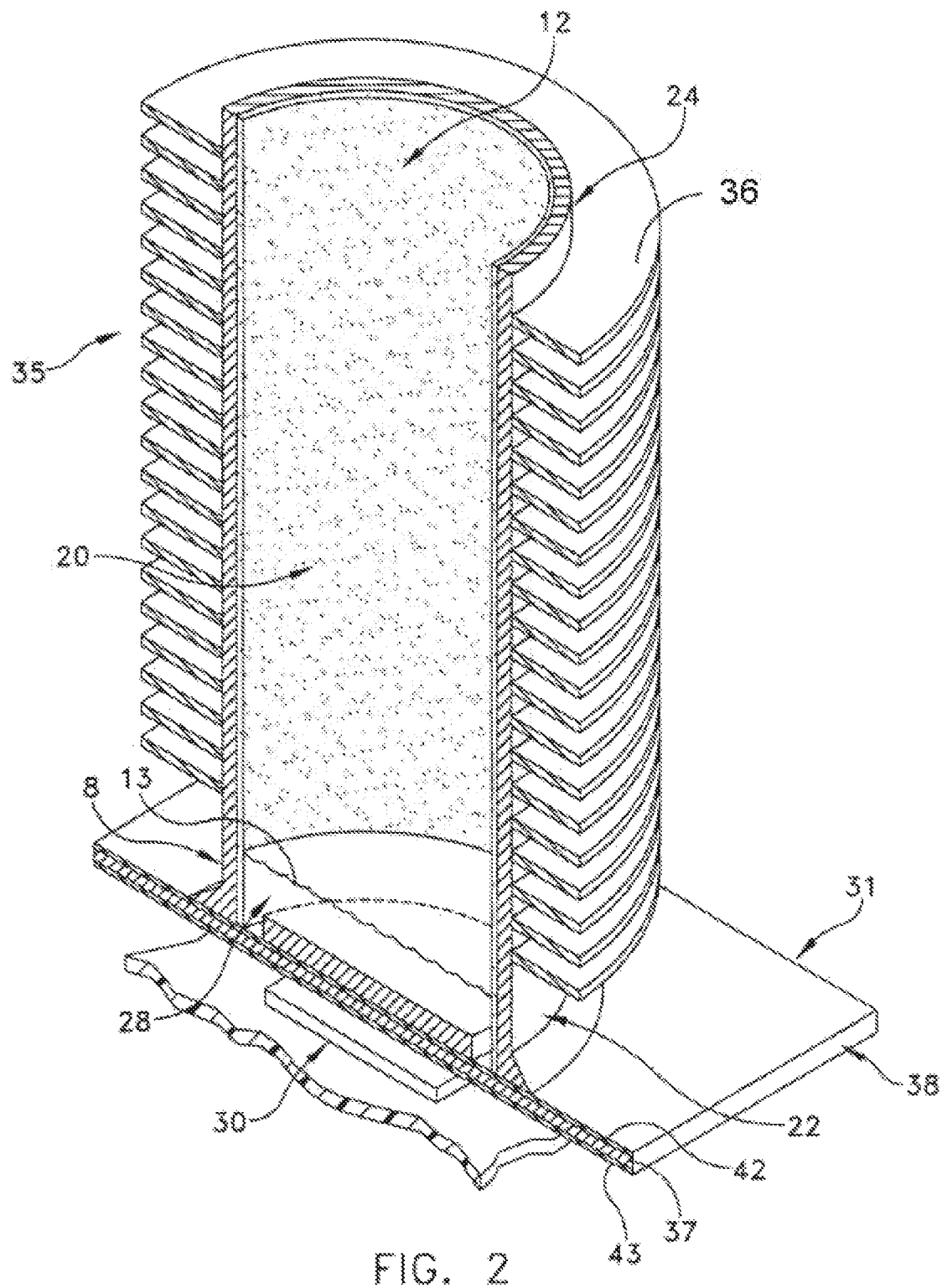
FIGS. 2-4 are cross-sectional perspective views of the CTE-matched heat pipe of FIG. 1.
Figure 3:
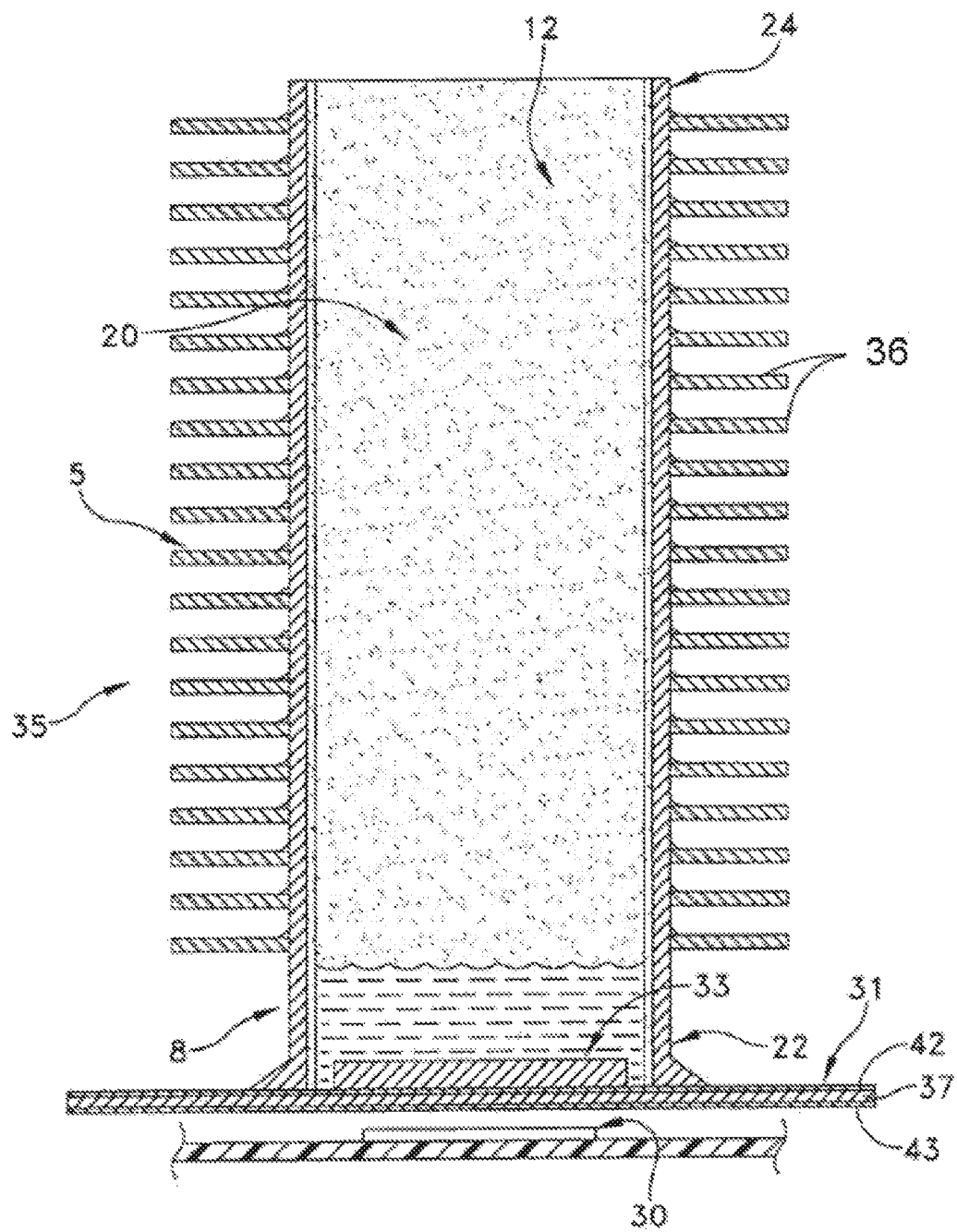
Figure 4:
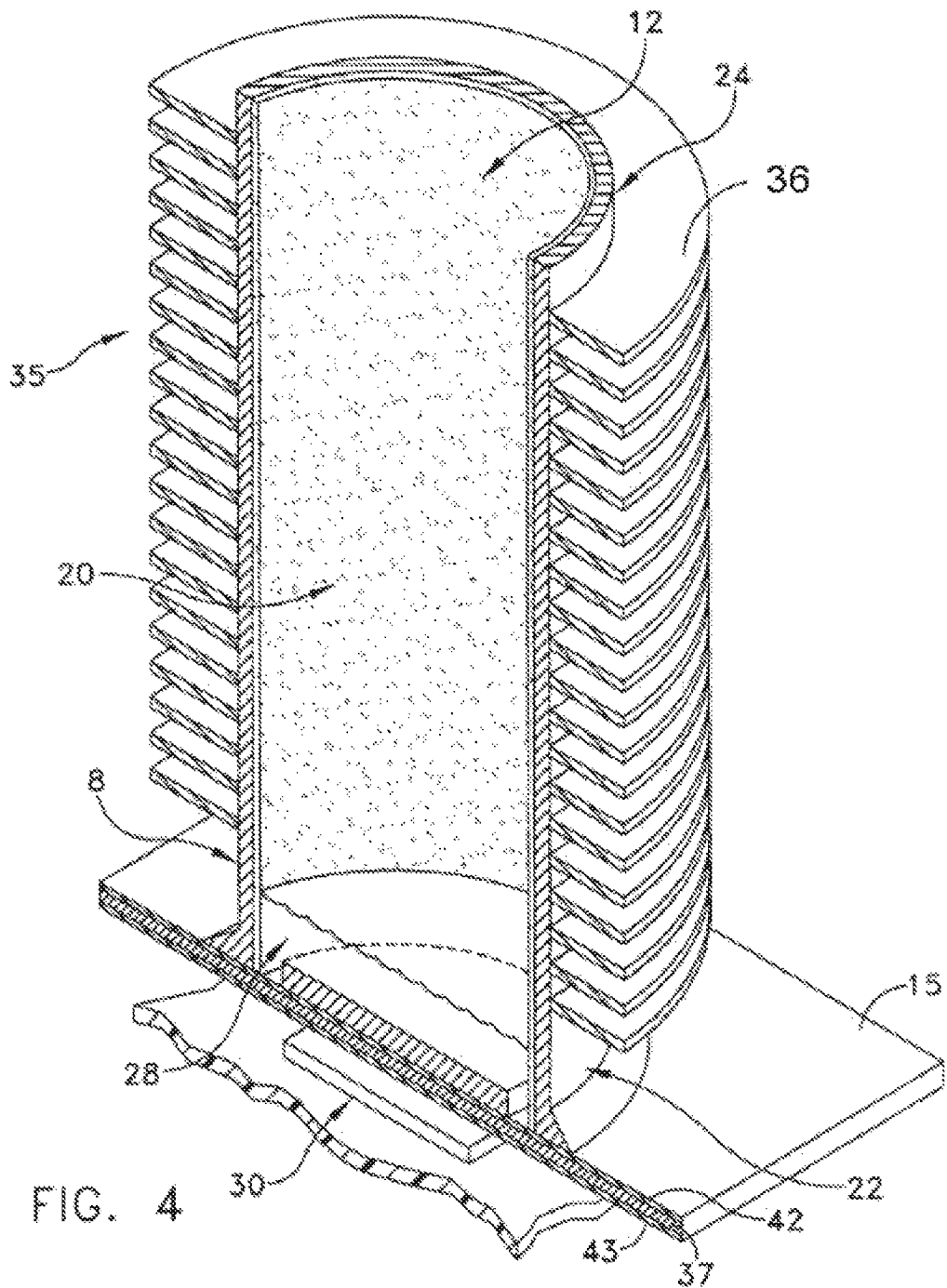

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Referring to FIGS. 1-4, a CTE-matched heat pipe 5 formed in accordance with one embodiment of the present invention includes a body 8, a wick 12, a working fluid 13, and a base 15. More particularly, body 8 may comprise a cylindrical tube formed from a highly thermally conductive metal, e.g., copper or its alloys or nickel or its alloys such as Monel (an alloy of nickel and copper) which could be incorporated into the structure with no significant changes in design or fabrication method. A vapor space is defined by a central passageway 20 extending along the longitudinal axis of body 8. Body 8 includes a bottom end 22 and a top end 24. Top end 24 is pinched off or otherwise sealed at a fill tube 26 during manufacture. Wick 12 is preferably formed from a brazed copper powder that is distributed throughout the inner surface of body 8 that defines central passageway 20 at bottom end 22. Although not preferred, wick 12 may be distributed throughout the inner surface of body 8 at top end 24, and may also comprise adjacent layers of screening or a sintered powder structure with interstices between the particles of powder, having an average thickness of about 0.1 mm to 1.0 mm.

In one preferred embodiment of the present invention, no wick structure is present at top end 24 (the condenser region of heat pipe 5). This is due in large part to the fact that gravity will drive the return of condensed working fluid 13 in the particular orientation shown in FIGS. 1-4. A wick structure may be incorporated in top end 24, i.e., in the condenser region of heat pipe 5, in order to provide return of condensate when the evaporator portion of the heat pipe is oriented so as to be above the condenser region. A wick structure in top end 24 may also reduce the temperature drop associated with condensation, as well as improve performance of the device, even when the wick is not required to return the working fluid.

Wick 12 may also include a screen or grooves integral with the inner surface of body 8. Also, a plastic-bonded wick in the evaporator and condenser regions of heat pipe 5 may be produced simultaneously and as a contiguous structure after body 8 is brazed to base 15. This would provide a contiguous fluid conduit between the evaporator and condenser regions of heat pipe 5, which is advantageous when the evaporator is elevated. This feature may be met with a screen wick by "pushing" the screen wick into an annular gap 28 located between bottom end 22 and base 15.

Working fluid 13 may comprise any of the well known two-phase vaporizable liquids, e.g., water, alcohol, Freon, methanol, acetone, fluorocarbons or other hydrocarbons, etc. CTE-matched heat pipe 5 is formed according to the invention by drawing a partial vacuum within body 8, and then back-filling with a small quantity of working fluid 13, e.g., just enough to saturate wick 12 just prior to final sealing of body 8 by pinching, brazing, welding or otherwise hermetically sealing fill tube 26, once base 15 is mounted to bottom end 22 of body 8. The atmosphere inside heat pipe 5 is set by an equilibrium of liquid and vapor.

Base 15 comprises a plurality of layers of selected materials so as to form a layered-composite having a low CTE, i.e., a CTE that nearly matches the CTE of a semiconductor, such as about 6.5 or less for silicon (FIG. 1). For example, base 15 may be formed from a direct bond copper (DBC) aluminum nitride. Base 15 may comprise a variety of shapes that could be dictated by both the geometry of the semiconductor device 30 that is to be cooled by CTE-matched heat pipe 5, or the shape of bottom end 22 of body 8. Base 15 is fastened directly to bottom end 22 of body 8 without the use of intermediate layers of CTE matching materials or ductile brazes. A base 15 formed from DBC aluminum nitride possesses several advantages that make it attractive for use as an interface to silicon semiconductor devices and substrates. As no interposing intermediate layers of CTE matching materials or ductile brazes are needed, bottom end 22 of CTE-matched heat pipe 5 will be arranged in intimate thermal communication with semiconductor device 30. The interface between bottom end 22 and semiconductor device 30 will also be significantly more resistant to thermal cycling and thermal fatigue. DBC aluminum nitride base 15 comprises high thermal conductivity, both in-plane and through-thickness, and its conductivity approaches that of aluminum. Thus, the construction of the present invention allows bottom end 22 of CTE-matched heat pipe 5 to approach the chip more closely, i.e., more closely than any method other than direct die contact or direct liquid cooling, so that the package thermal resistance is as low as possible.

Figure 5:
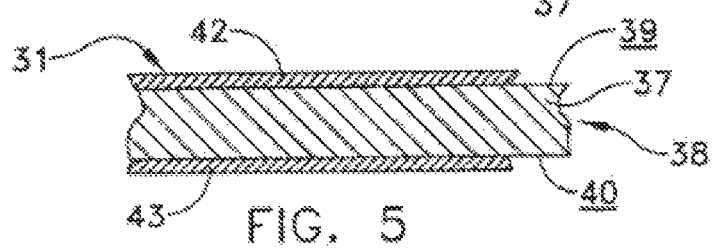
FIG. 5 is a broken-away cross-sectional view of a portion of the low CTE base illustrated in FIGS. 2-4.

In another embodiment, base 31 may include a plurality of layers to form a layered-composite 38 comprising a layer of molybdenum 37 having a top surface 39 and a bottom surface 40 (FIG. 5). A first layer 42 of OFE copper foil is disposed over top surface 39 and a second layer 43 of OFE copper foil is disposed over bottom surface 40 so as to form layered-composite 38 (FIGS. 2-5). In this way, a layered composite is formed comprising a first layer 42 of relatively high CTE material (i.e., a CTE higher than that for silicon), a second layer 43 of relatively high CTE material (i.e., a CTE higher than that for silicon), and an intermediate layer 37 of relatively low CTE material, thus forming layered-composite 38 having an internal structure comprising high CTE material/low CTE material/high CTE material. The CTE of such a layered-composite is often in a range from about 2.5 to about 10, with a range from about 3 to about 6.5 being preferred for most silicon applications.

When the present invention comprises a layered-composite 38 formed from layers of copper/molybdenum/copper, a thickness ratio of 13%/74%/13% has been found to provide adequate results. A copper/molybdenum/copper layered-composite 38 comprises mechanical properties that are suitable for higher temperature processing. This allows a silicon die to be attached to base 31, via soldering, without structural instability which may cause the silicon to crack or break.

Table 1 below presents thermal conductivity and CTE properties of different common materials that may be arranged as a layered-composite 38 in conformance with the present invention. In tower applications, it is preferred that the high CTE layers of material be selected so that base 15 may be fastened directly to bottom end 22 of body 8 without the use of any intermediate low CTE materials.

| Material | Coefficient Thermal Expansion (ppm/° C.) |
|---|---|
| Silicon Carbide | 2.6 |
| Silicon | 2.6 |
| Molybdenum | 4.9 |
| Graphite | 5 |
| Beryllium Oxide | 8 |
| Annealed Copper | 16.4 |
| Aluminum Nitride | 3.6 |
| 80Mo20Cu | 7.2 |
| 75W25Cu | 10.2 |
| 33Cu/74Mo/33Cu | 10 |
| 13Cu/74Cu/13Cu | 6.5 |

A brazed wick 33 may be formed on the inner surface of base 15 or 31. Depending upon the heat load and particular power density, other wick structures may be appropriate. Examples of such structures include screen bonded to the heat input surface by spot-welding or brazing, a monolayer of powder metal, grooves cut in the copper layer of base 31, or an array of posts. Furthermore, it is also anticipated that a plastic-bonded wick may be substituted for the brazed copper wick.

In practice, semiconductor 30 is mounted to the bottom surface of base 31. Heat from semiconductor 30 is conducted through base 31 into bottom end 22 of heat pipe 5. The heat causes working fluid 13 in wick 12 to evaporate. The vapor travels through central passageway 20 to condenser region 35 of body 8. At condenser region 35, the vapor contacts the inner surface of body 8, condenses, and gives up its latent heat through condensation. Working fluid 13 then returns to bottom end 22 by either gravity, or through the capillary action in a portion of wick 12 on the inner surface of body 8 at condenser 35.

As shown in FIGS. 1-4, fins 36 or other suitable extended surfaces may be mounted to body 8 at condenser region 35 to convey the heat to the ambient environment. It is anticipated that other fin types and structures are possible, including a folded fin wrapped around a cylindrical heat pipe envelope, an array of plate fins mounted radially around the condenser, or an array of fins mounted to the top of the device.

Figure 6:
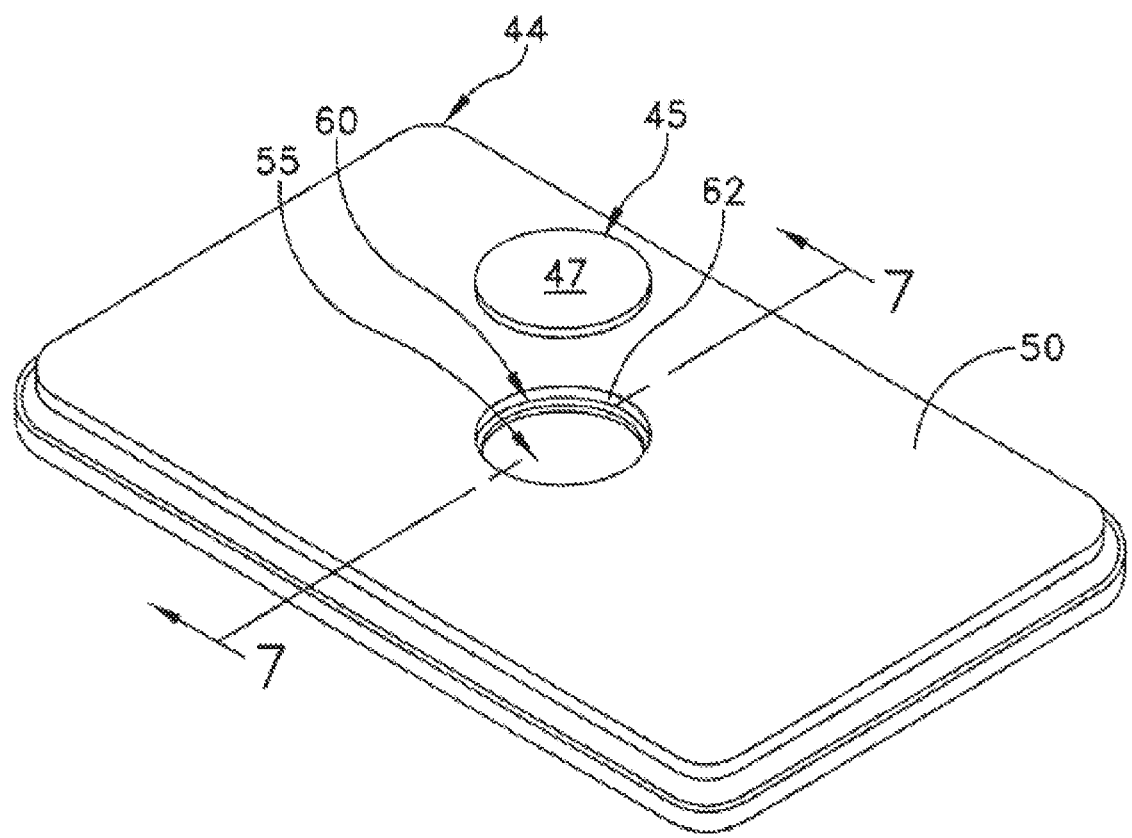
FIG. 6 is a perspective view of a composite base comprising a high CTE portion and a complementary low CTE insert portion positioned for placement within an opening.
Figure 7:
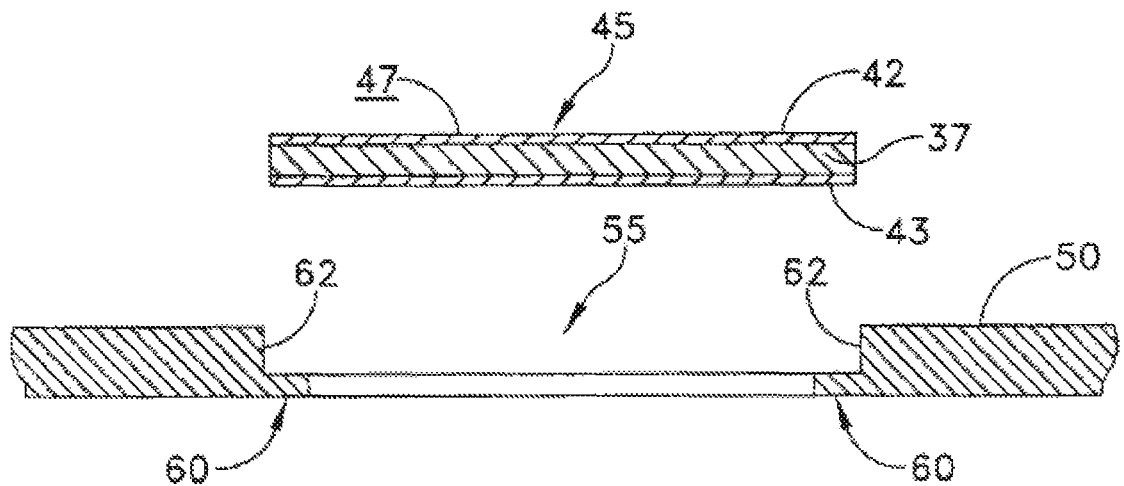
FIG. 7 is an exploded cross-sectional view of a composite base, as taken along lines 7-7 in FIG. 6.
Figure 8:
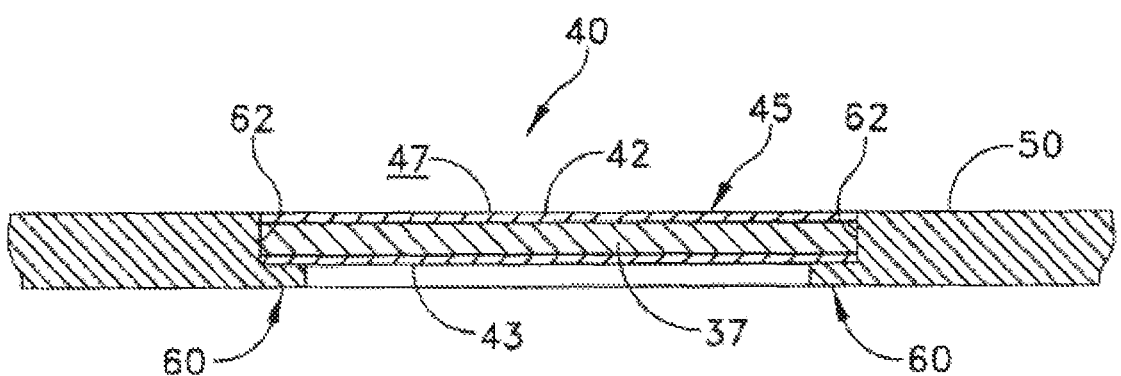
FIG. 8 is a cross-sectional view of the assembled composite base shown in FIG. 7.
Figure 9:
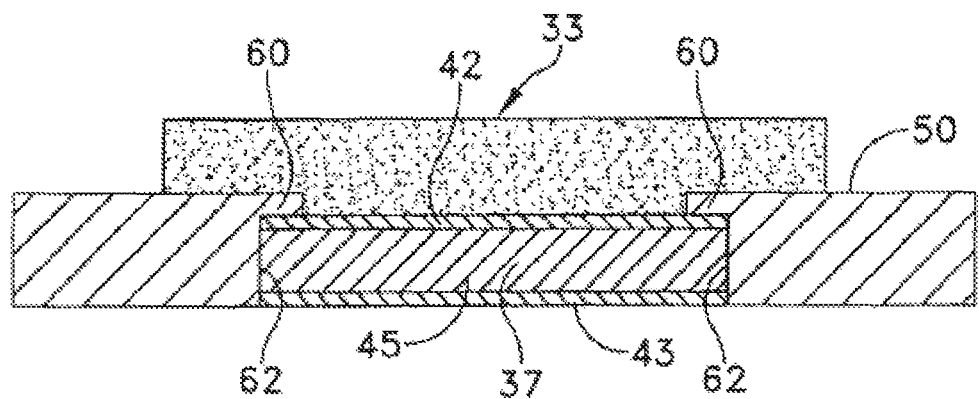
FIG. 9 is a cross-sectional view of another embodiment of composite base having a wick applied to a surface of a low CTE insert portion.
Figure 10:
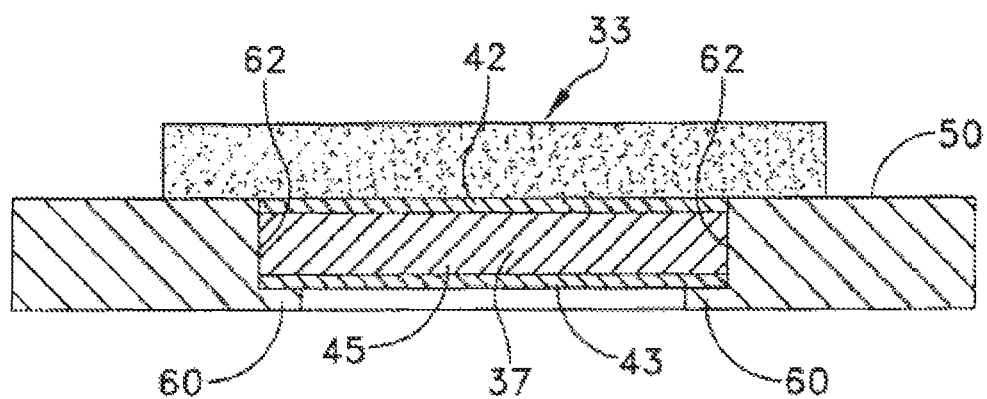
FIG. 10 is a cross-sectional view of yet another embodiment of composite base having a wick overlying a low CTE insert portion.

Referring to FIGS. 6-12, a base 44 is also provided by the present invention in which a relatively low CTE layered-composite insert 45 is positioned within a relatively high CTE cold plate 50, such as a copper plate. An opening 55 is formed within cold plate 50 that includes a counter-sunk region that provides an annular ledge 60 and a substantially vertical wall 62 (FIGS. 6-8). Layered-composite insert 45 is positioned within opening 55 and fixedly fastened in intimate thermal communication with annular ledge 60 and vertical wall 62 so as to complete base 44. Layered-composite insert 45 and cold plate 50 may be bonded together using conventional methods, such as brazing, soldering, adhesives, or direct bond attachment. Layered-composite insert 45 comprises a plurality of layers wherein the layers may include OFEcopper/aluminum nitride/OFEcopper, copper/molybdenum/copper, or even copper/graphite (Table 1). In a preferred embodiment, layered-composite insert 45 includes an intermediate layer 37 of molybdenum, a top layer 42 of copper and a bottom layer 43 of copper, and may be formed with a periphery that conforms or is complementary to the geometric "foot-print" of semiconductor device 30, e.g., square, rectangular, circular or ellipsoidal, etc. When mounted, the surface of semiconductor device 30 only makes thermal contact with a top mounting surface 47 of layered-composite insert 45.

Figure 11:
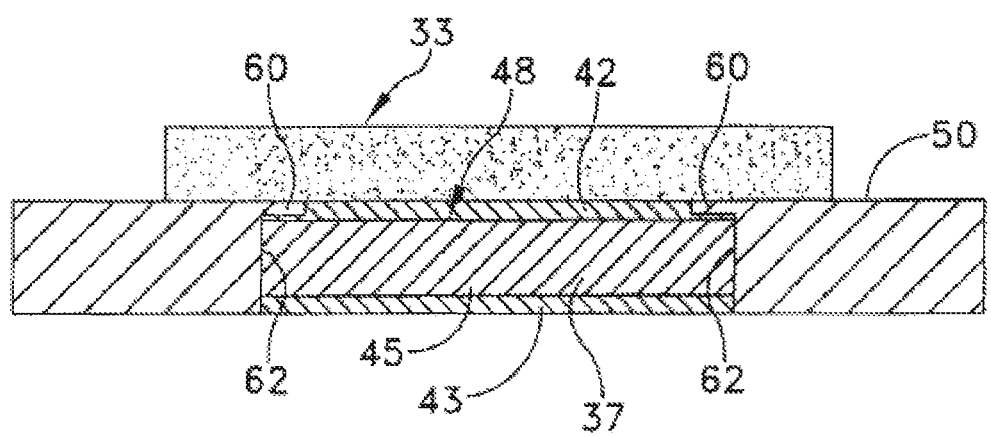
FIG. 11 is a cross-sectional view of a further embodiment of a CTE-matched base.
Figure 12:
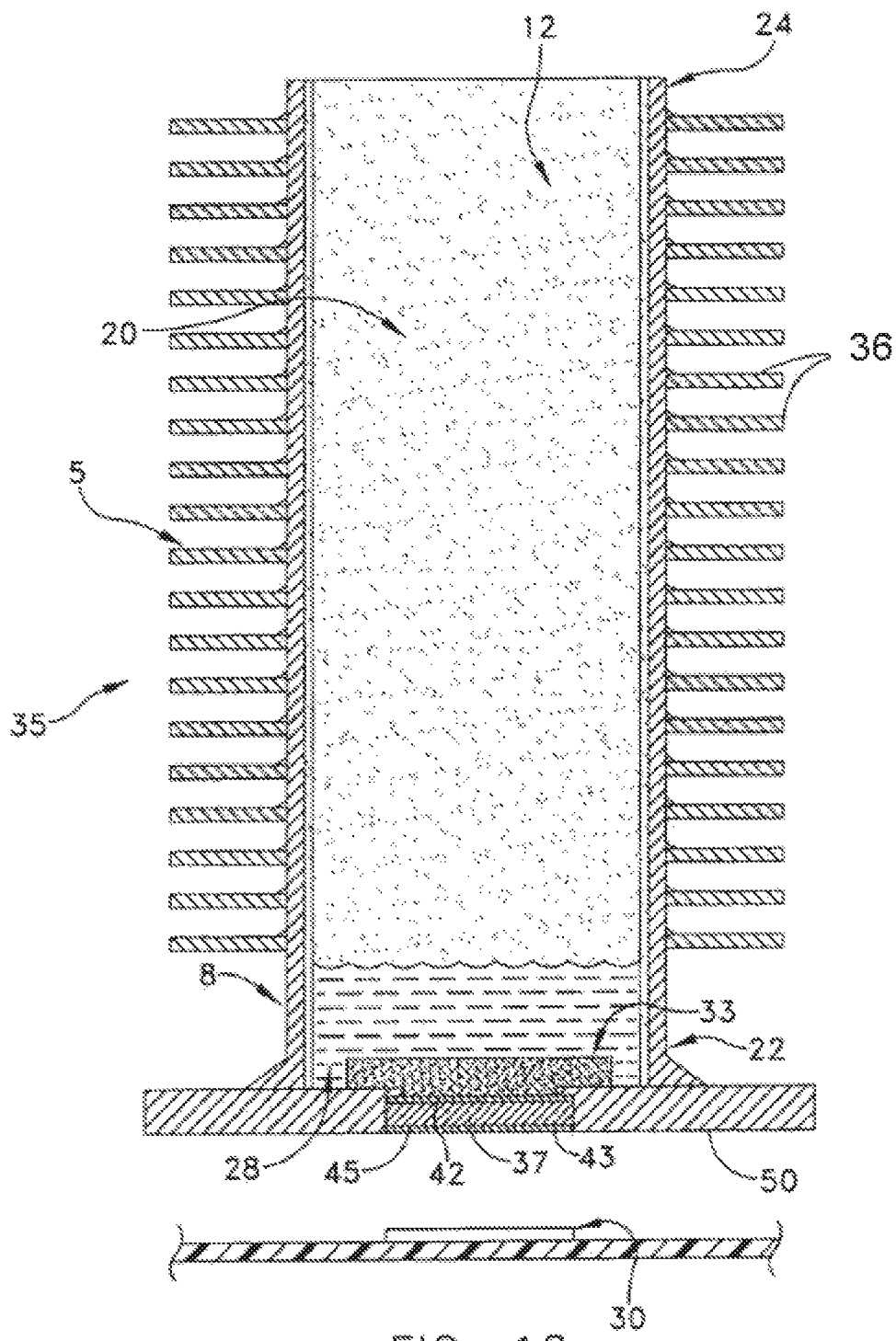
FIG. 12 is a cross-sectional view of tower heat pipe having a low CTE composite insert positioned within a high CTE base.

Referring to FIGS. 9-12, a capillary wick 33 may be formed on a surface of layered-composite insert 45. Also, layered-composite insert 45 may be complementarily formed or machined so as to have a central prominence 48 projecting upwardly into opening 55, thereby to improve engagement with annular ledge 60 and vertical wall 62 (FIG. 11). In this way, the top or bottom surfaces of layered-composite insert 45 may be arranged in coplanar relation with a top or bottom surface of cold plate 50. Of course, central prominence 48 may project beyond the top or bottom surfaces of any cold plate in order to form a land for engaging a semiconductor package. Also, wick 33 may be formed and arranged so as to overlie the entire outwardly facing surface of layered-composite insert 45 while only covering an adjacent portion of base 44. Of course, wick 33 may be formed and arranged so as to overlie the entire surface of layered-composite insert 45 and base 44.

Figure 13:
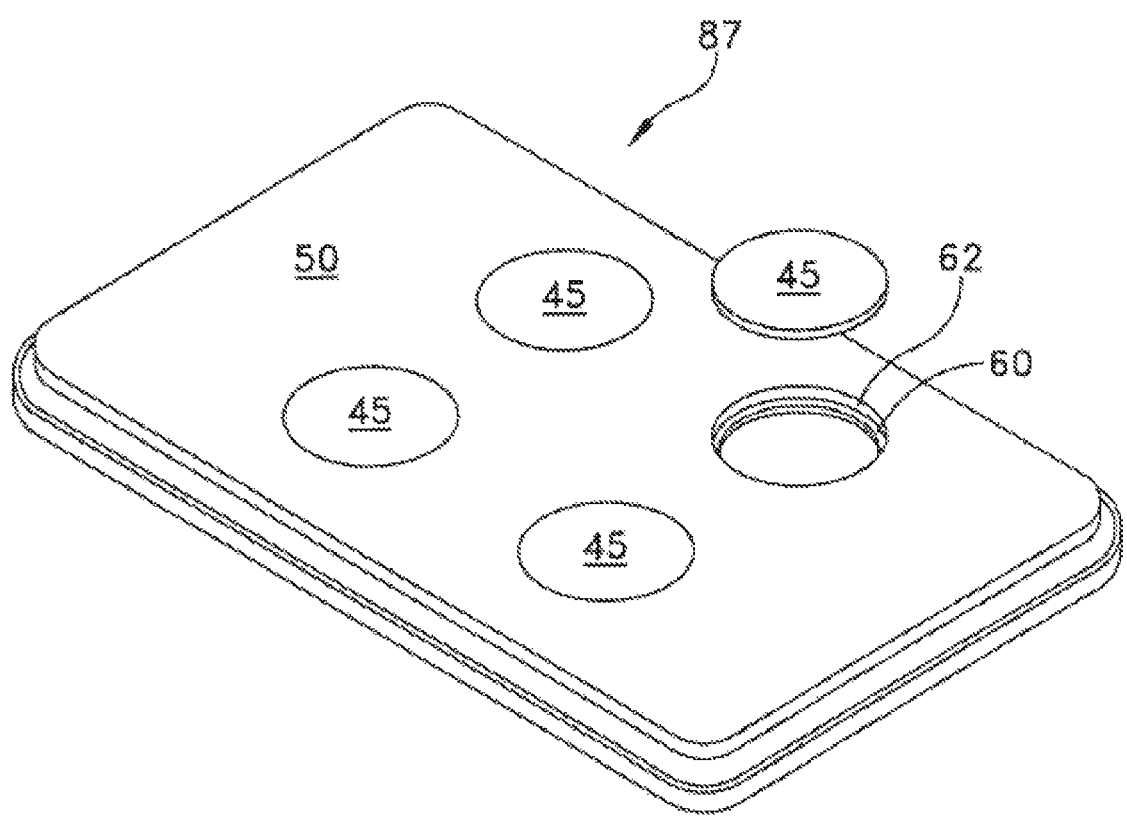
FIG. 13 is a perspective view of another embodiment of composite base having a plurality of low CTE inserts.
Figure 14:
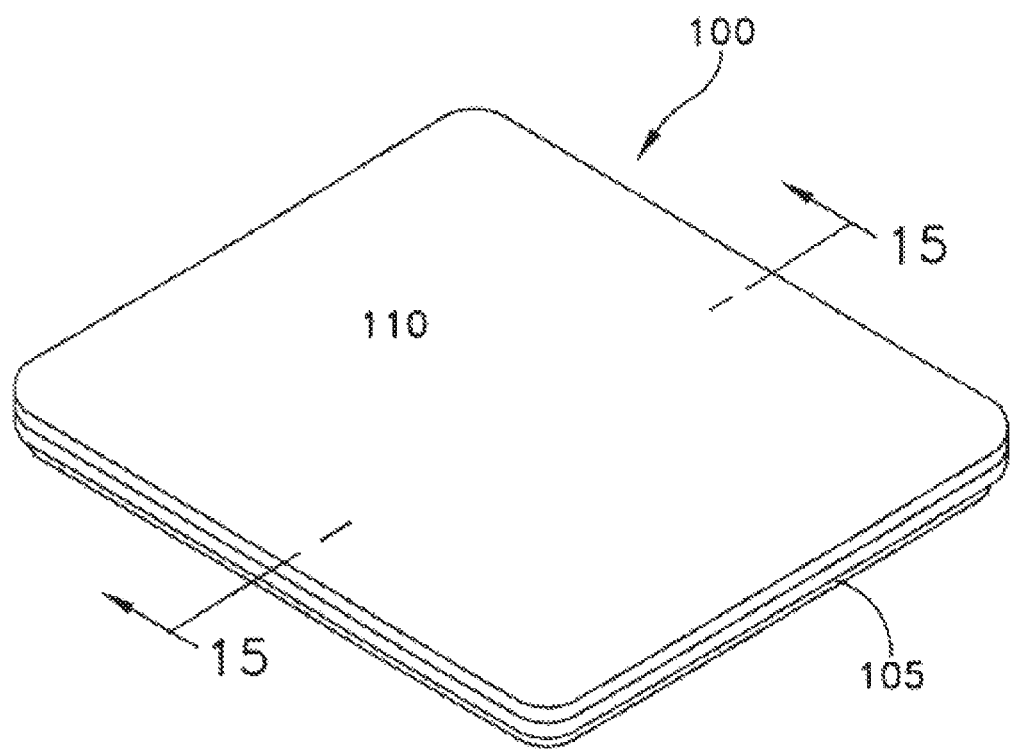
FIG. 14 is a perspective view of a planar heat pipe heat spreader formed in accordance with another embodiment of the present invention.
Figure 15:
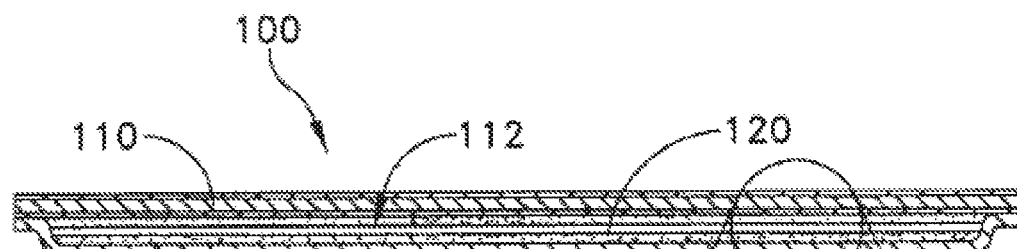
FIG. 15 is a cross-sectional view of the embodiment of composite base shown in FIG. 14, as taken along lines 15-15 in FIG. 14.
Figure 16:
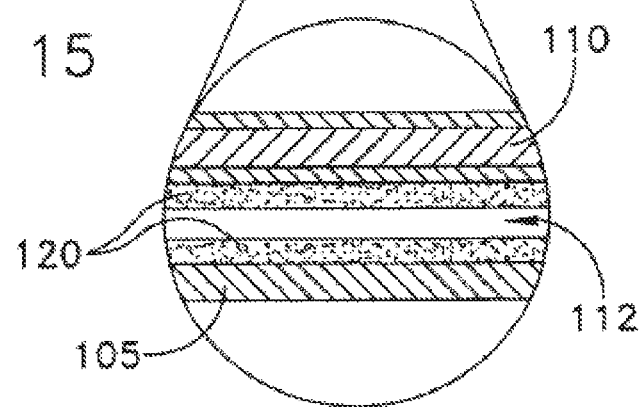
FIG. 16 is an enlarged view of the cross-section shown in FIG. 15.
Figure 17:
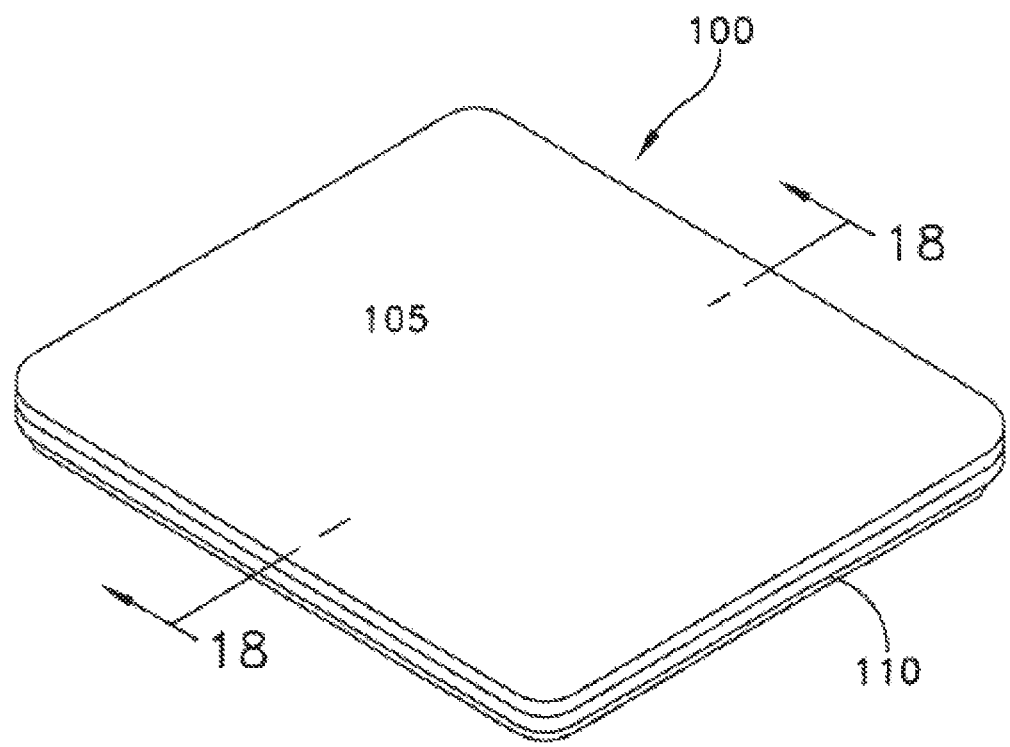
FIG. 17 is a perspective view of a planar heat pipe comprising a composite wall formed in accordance with another embodiment of the invention.
Figure 18:
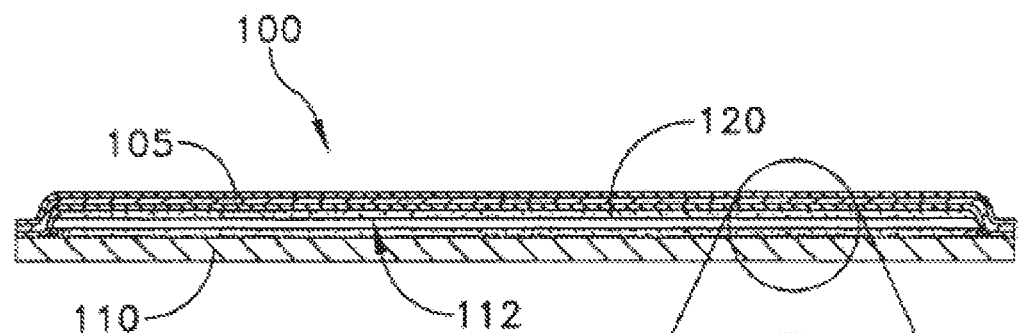
FIG. 18 is a cross-sectional view of the planar heat pipe shown in FIG. 17, as taken along lines 19-19 in FIG. 17.
Figure 19:
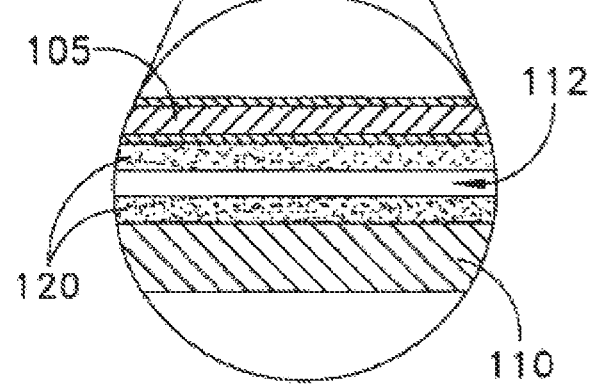
FIG. 19 is an enlarged cross-sectional view of the interior wall structures of a planar heat pipe formed in accordance with the present invention.
Figure 20:
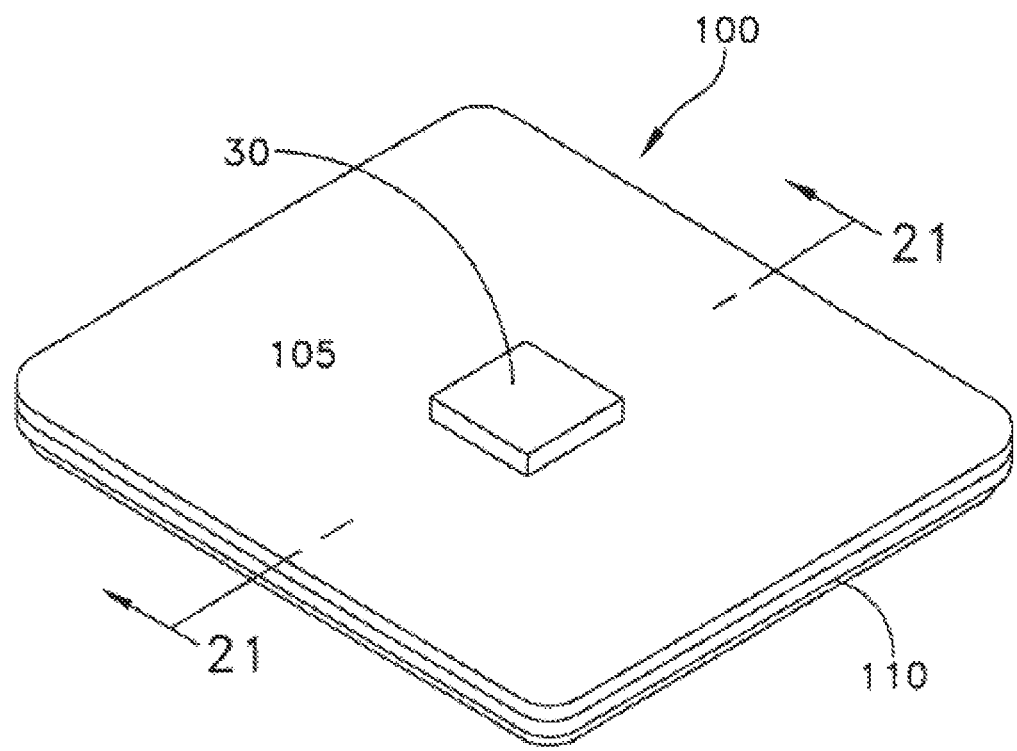
FIG. 20 is a perspective view of a semiconductor device mounted on the planar heat pipe shown in FIGS. 17-18.
Figure 21:
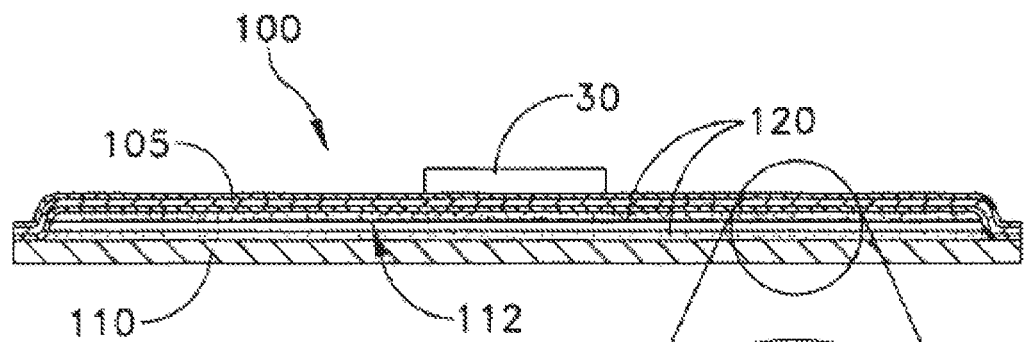
FIG. 21 is a cross-sectional view of the planar heat pipe shown in FIG. 20, as taken along lines 21-21 in FIG. 20.
Figure 22:
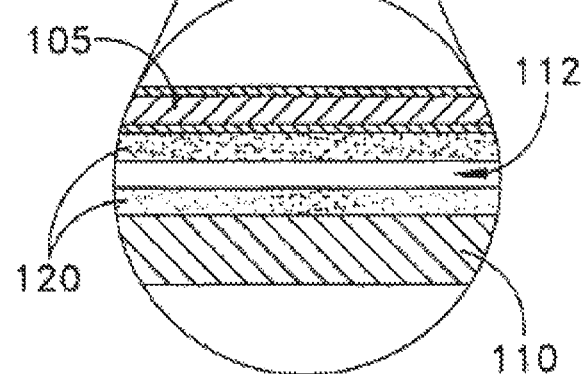
FIG. 22 is an enlarged cross-sectional view of the interior wall structures of a planar heat pipe formed in accordance with the present invention.
Figure 26:
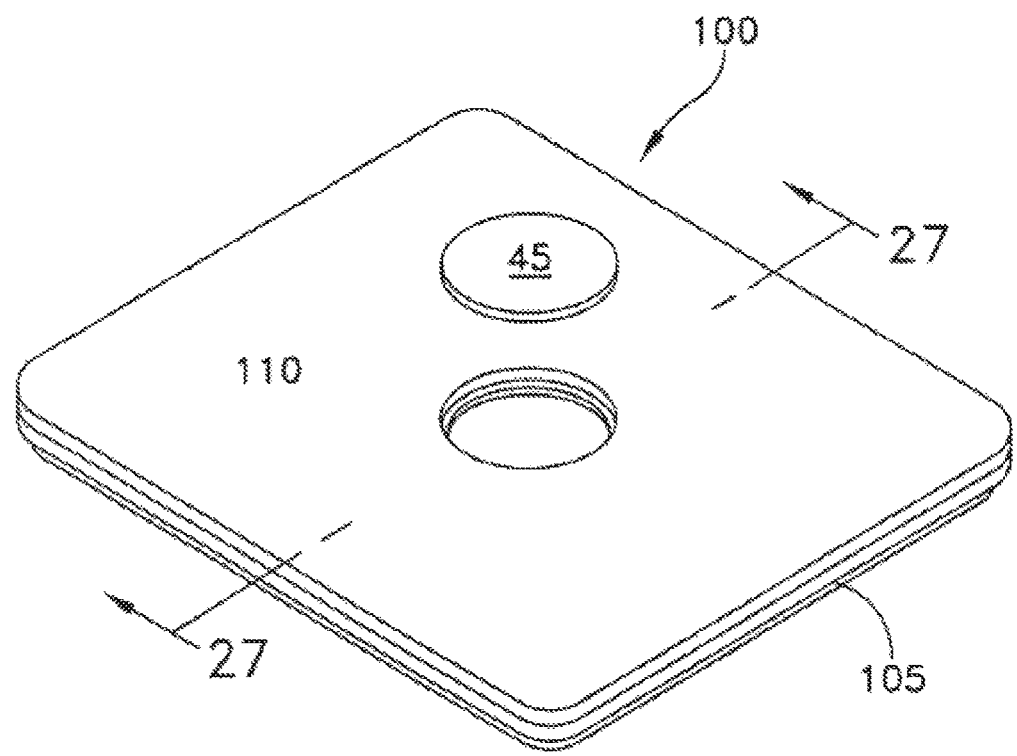
FIG. 26 is a perspective view of a planar heat pipe comprising a composite wall and a low CTE insert formed in accordance with another embodiment of the invention.
Figure 27:
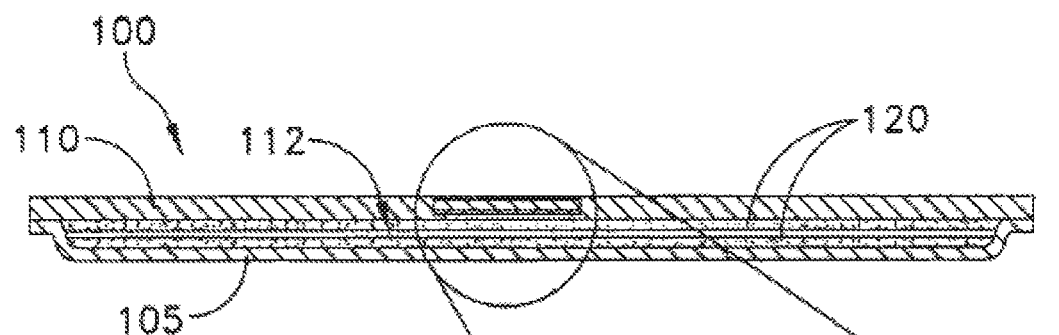
FIG. 27 is a cross-sectional view of the planar heat pipe shown in FIG. 26, as taken along lines 27-27 in FIG. 26.
Figure 28:
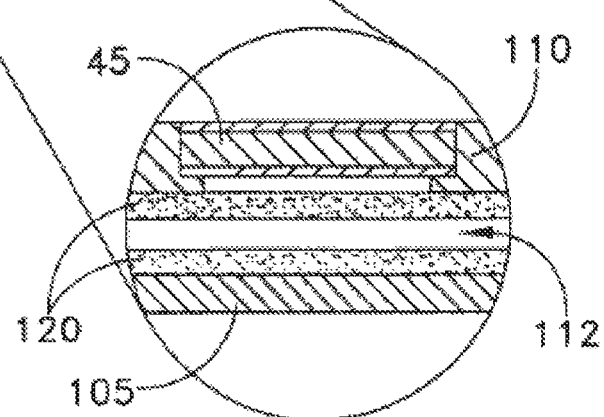
FIG. 28 is an enlarged cross-sectional view of the interior wall structures of a planar heat pipe formed in accordance with the present invention.

Referring to FIG. 13, a base 87 may include a plurality of layered-composite inserts 45 within a single high CTE cold plate 50. Each low CTE layered-composite insert 45 may be joined to cold plate 50 in any one, or a combination of the foregoing fixation methods.

Referring to FIGS. 14-22 a planar heat pipe 100 may be formed in accordance with the present invention having one or more walls that comprise at least one of a copper/molybdenum/copper or copper/aluminum nitride/copper layered-composite substantially similar in structure to that of layered-composite portion 45. For example, a planar heat pipe 100 may include a first plate 105 and a second plate 110 that are hermetically sealed at their respective peripheral edges so as to define a vapor chamber 112. Vapor chamber 112 is partially evacuated and back filled with a suitable two-phase working fluid, e.g., water, Freon, ammonia, etc. A wick 120 is disposed upon one or more of the surfaces of the internally facing walls that together define vapor chamber 112.

In another embodiment, planar heat pipe 130 may be formed so as to include one or more layered-composite inserts 45 (FIGS. 23-28). Either first plate 105 or second plate 110 may define one or more openings that are closed by the introduction of layered-composite inserts 45.

Figure 29:
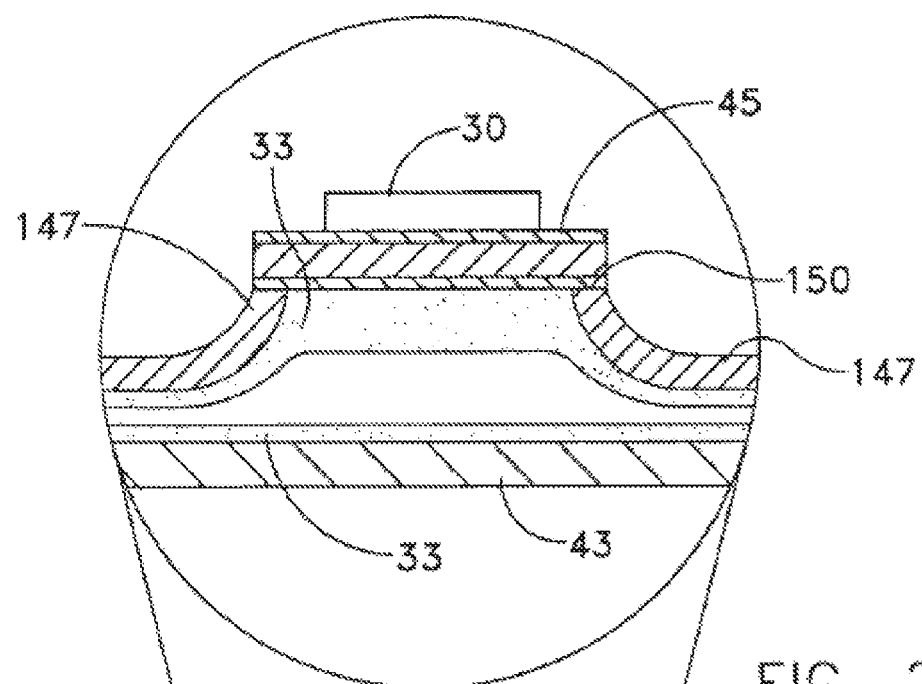
FIG. 29 is a cross-sectional view of yet a further embodiment of a planar heat pipe having a composite wall structure formed in accordance with the present invention.
Figure 30:
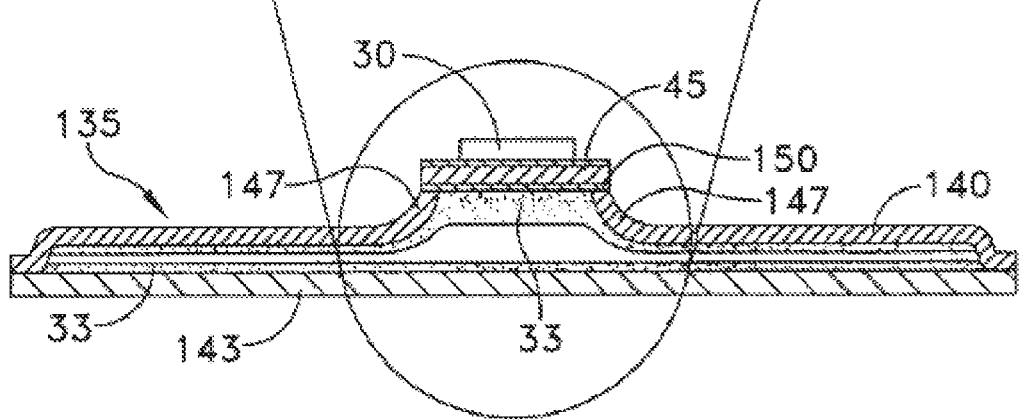
FIG. 30 is an enlarged cross-sectional view of the interior wall structure of a planar heat pipe formed in accordance with the present invention.

Referring to FIGS. 29-30, a heat transfer base 135 comprises a first plate 140 and a second plate 143 arranged to form a planar heat pipe. One or more openings in first plate 140 are hermetically sealed by the introduction of a layered-composite insert 45. Each opening in first plate 140 is formed within first plate 140 by a piercing or forming process so as to form an outwardly projecting, annular wall 147. In one example, high CTE cold plate 135 comprises a copper sheet that has been pierced so as to draw an outwardly projecting, substantially annular wall 147 defining an outwardly facing, annular surface 150. The peripheral top or bottom surface of layered-composite insert 45 is arranged so as to engage annular surface 150 of annular wall 147, and the two are fixedly bonded to one another by any of the aforementioned conventional techniques, such as brazing, soldering, adhesives, or direct bond attachment. Wick 33 may be formed within the closed recess in cold plate 135 that is defined by layered-composite 45 and annular wall 147.

It is to be further understood that the present invention is by no means limited only to the particular constructions herein disclosed and shown in the drawings, but also comprises any modifications or equivalents within the scope of the claims.

What is claimed is:

1. A heat transfer device comprising:
a heat pipe having a first wall portion, a second wall portion, and a vapor chamber disposed between the first wall portion and the second wall portion,
wherein the first wall portion includes a plurality of layers of different materials, and wherein one of the layers of materials has a lower coefficient of thermal expansion than another one of the layers of materials, wherein the heat pipe has a counter-sunk region that includes a wall and a ledge adjacent the wall, wherein the wall extends around and at least partially defines an opening, wherein the first wall portion is recessed in the opening of the counter-sunk region of the heat pipe and contacts the ledge, and the first wall portion is in thermal communication with both the ledge and the wall of the counter-sunk region.

2. The heat transfer device of claim 1, wherein the counter-sunk region surrounds the entire first wall portion.

3. The heat transfer device of claim 1, wherein a top surface of the first wall portion is co-planar with a top surface of the heat pipe.

4. The heat transfer device of claim 1, wherein the first wall portion is bonded to the counter-sunk region with at least one of brazing, soldering, adhesives, or direct bond attachment.

5. The heat transfer device of claim 1, wherein the layers of the first wall portion include at least one of an arrangement of OFEcopper/aluminum nitride/OFEcopper, copper/molybdenum/copper, or copper/graphite.

6. The heat transfer device of claim 1, wherein the first wall portion includes an intermediate layer of molybdenum, a top layer of copper, and a bottom layer of copper.

7. The heat transfer device of claim 1, wherein the counter-sunk region of the heat pipe is within a third wall portion of the heat pipe.

8. The heat transfer device of claim 7, wherein the third wall portion includes a crimped outer perimeter in contact with the second wall portion.

9. The heat transfer device of claim 1, wherein the wall of the counter-sunk region has a depth and the first wall portion has a thickness equal to the depth of the wall of the counter-sunk region.

10. The heat transfer device of claim 1, further comprising a capillary wick formed on an interior surface of the first wall portion.

11. The heat transfer device of claim 1, further comprising a wick disposed within the vapor chamber.

12. The heat transfer device of claim 1, wherein the first wall portion and the counter-sunk region are in communication with the vapor chamber.

13. The heat transfer device of claim 1, wherein a first surface of the first wall portion is parallel to the ledge and a second surface of the first wall portion is parallel to the wall of the counter-sunk region.

14. The heat transfer device of claim 1, wherein the first wall portion abuts the wall of the counter-sunk region and the wall of the counter-sunk region surrounds a periphery of the first wall portion.

15. The heat transfer device of claim 1, wherein the counter-sunk region is formed from a material that has a higher coefficient of thermal expansion than the first wall portion.

16. A heat transfer device comprising:
a heat pipe having a first wall, a second wall, and a third wall that together define an interior vapor chamber, wherein a through-opening is defined in the third wall, and wherein the first wall is positioned to close the through-opening;
wherein the first wall includes a plurality of layers of different materials, wherein one of the layers of materials has a lower coefficient of thermal expansion than another one of the layers of materials, wherein the third wall includes a counter-sunk region, wherein the counter-sunk region includes a ledge, and wherein the first wall rests in contact on the ledge so as to close the through-opening.

17. The heat transfer device of claim 16, wherein the third wall portion includes a crimped outer perimeter in contact with the second wall portion.

18. A heat transfer device comprising:
a heat pipe having a first wall portion, a second wall portion, and a third wall portion that are coupled together, wherein the first wall portion is spaced apart from the second wall portion, the third wall portion extends between the first wall portion and the second wall portion, and the first, second, and third wall portions together define a vapor chamber, wherein a plane extends through the heat transfer device such that the entire first wall portion is on a first side of the plane and the entire second wall portion is on a second, opposite side of the plane, and
wherein the first wall portion includes a plurality of layers of different materials, wherein one of the layers of materials has a lower coefficient of thermal expansion than another one of the layers of materials, wherein the first wall portion is supported by and sealed to a surface of the third wall portion along a periphery of the first wall portion.

19. The heat transfer device of claim 18, wherein the third wall portion surrounds the periphery of the first wall portion.

20. The heat transfer device of claim 18, wherein the entire third wall portion is on the first side of the plane, and includes a crimped outer perimeter in contact with the second wall portion.

* * * * *